(12) United States Patent
Chiu et al.

(10) Patent No.: US 6,584,606 B1
(45) Date of Patent: Jun. 24, 2003

(54) FAST METHOD OF I/O CIRCUIT PLACEMENT AND ELECTRICAL RULE CHECKING

(75) Inventors: Charles S. Chiu, Essex Junction, VT (US); James P. Libous, Endwell, NY (US); Rory D. Loughran, Richmond, VT (US); Joseph Natonio, Poughkeepsie, NY (US); Robert A. Proctor, South Burlington, VT (US); Gulsun Yasar, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 89 days.

(21) Appl. No.: 09/584,416

(22) Filed: Jun. 1, 2000

(51) Int. Cl.[7] .............................................. G06F 17/50
(52) U.S. Cl. ................................. 716/10; 716/4; 716/8
(58) Field of Search ................................... 716/8, 10, 4

(56) References Cited

U.S. PATENT DOCUMENTS

| | | |
|---|---|---|
| 4,594,677 A | 6/1986 | Barlow |
| 5,224,057 A | 6/1993 | Igarashi et al. |
| 5,258,919 A | 11/1993 | Yamanouchi et al. |
| 5,568,395 A | 10/1996 | Huang |
| 5,883,814 A | 3/1999 | Luk et al. |
| 5,923,059 A | 7/1999 | Gheewala |

OTHER PUBLICATIONS

Buffet, P.H. et al, "Methodology for I/O cell placement and checking in Asic designs using area–array grid", May 2000, IEEE, pp. 125–128.*

Lu, L.Y. et al, "An automated, structured layout for staggered pad, I/O bound ASIC", Sep. 1990, IEEE, pp. 11/6.1–11/6.4.*

Hongxia, Xia et al, "Optimization–based placement algorithm for BiCMOS leaf cell generation", Oct. 1994, IEEE, pp. 1227–1237.*

Caldwell, A. et al, "Implications of area–array I/O for row based placement methodology", Feb. 1998, IEEE, pp. 93–98.*

Pedram, M. et al, "Floorplanning with pin assignment", Nov. 1990, IEEE, pp. 98–101.*

Kar, J. et al, "Optimizing C4 bump placements for a peripheral I/o design", Jun. 1999, IEEE, pp. 250–254.*

Yasar, G. et al, "I/O cell placement and electrical checking methodology for ASIC's with peripheral I/O's", Mar. 2001, IEEE, pp. 71–75.*

* cited by examiner

Primary Examiner—John F. Niebling
Assistant Examiner—Stacy Whitmore
(74) Attorney, Agent, or Firm—DeLio & Peterson, LLC; Kelly M. Reynolds; Richard A. Henkler

(57) ABSTRACT

A method of analyzing I/O cell layouts for integrated circuits, such as ASICs, includes defining a proposed I/O cell layout on a selected chip image, providing a set of limit rules for electromigration, IR voltage drop and di/dt noise for the selected chip image, providing characteristics for each I/O cell type used in the proposed I/O cell layout, checking the proposed I/O cell layout by applying the limit rules to the proposed I/O cell layout and reporting all I/O cells used in the proposed I/O cell layout that do not meet the limit rules for the selected chip image.

20 Claims, 2 Drawing Sheets

FAST METHOD OF I/O CIRCUIT PLACEMENT AND ELECTRICAL RULE CHECKING

BACKGROUND OF THE INVENTION

1. Field of the Invention

This invention relates to methods of analyzing I/O cell layouts for integrated circuits, where the layout includes a location and type for each I/O cell used in the integrated circuit. More specifically, this invention relates to methods of analyzing a proposed I/O cell layout at an early stage in the design of an integrated circuit to determine whether the relative arrangement of the I/O cells and the particular types of I/O cells chosen for the layout will meet design goals with respect to power bus voltage drop, electromigration and noise limits.

2. Description of Related Art

To reduce cost and speed design, integrated circuits, such as custom logic application specific integrated circuits (ASIC) chips, are usually constructed from standard elements. These elements include such items as the die size for the silicon chip, the packaging, and the input/output (I/O) circuitry.

Typically, each I/O circuit is selected by the integrated circuit designer from a library of different types of standard I/O circuits that provide desirable I/O functions. Some I/O circuits in the library will be input only, some will be output only, some will provide both input and output functionality with various testing functions, etc. Each circuit is configured similarly with respect to common connection points, such as the location of the connections to power and ground. This arrangement allows any I/O circuit (referred to as an I/O cell) to be moved into any one of numerous standardized I/O cell placement locations on a standardized silicon die (referred to as a chip image).

At an early stage of ASIC design, the chip designer selects a particular chip image suitable for the circuit of interest. As an example, a family of popular chip images includes a variety of silicon chips of increasing die sizes, each chip being configured with wiring to supply ground and power connection to multiple I/O cell placement locations, all of which are located along the four edges surrounding the perimeter of the chip. Larger peripheral chip images have more available I/O cell placement locations where the standard I/O cells can be positioned.

One important consideration for the chip designer will be the selection of a large enough chip image to accommodate all the I/O cells needed for the ASIC to communicate with other off-chip system devices. A typical ASIC design may have from 200 to more than 1000 different I/O signals, each one requiring a corresponding I/O cell to handle its I/O signal.

The available I/O cell placement locations along the perimeter of the chip are all similar so that, in theory, almost any I/O cell can be positioned there. In practice, however, not all these locations are identical and there are limits to the placement of different types of I/O cells in the available locations. For example, some locations are farther from the power supply, and have a higher resistance connection to power and/or ground. This limits the current that I/O cells positioned here may draw. Another limit relates to test circuits which can be placed only in special test circuit I/O cell slots. There are other limits on placement needed to minimize electromigration and noise.

In the design of ASIC chips, the designer usually knows the input and output requirements of the chip long before the details of the internal ASIC chip circuitry are finalized. In peripheral chip image designs, each I/O cell is connected to a particular pin extending out of the ASIC chip. Thus, positioning the I/O cells controls the design of the circuit board that the chip will be installed into. The circuit board must bring the proper input and output signals to the correct pin.

Often, the assignment of the I/O cells to their location is done very early so that related design of the circuitry connected to the ASIC can be done. Any changes made late in the design process to this early proposed I/O cell layout increases cost. It is important to be able to determine as early as possible whether the proposed layout for the I/O cells will meet all design goals.

Although the discussion above describes peripheral chip designs, in other designs, I/O cells may be placed at interior locations of the chip. Also, for any particular die, whether it provides peripheral I/O placement locations only, or permits interior I/O cell placement, there may be different packages into which the silicon chip may be mounted. The packaging may also put limits on the placement of the I/O cells on the silicon die. Throughout the discussion below the term "chip image" will be used to generally refer to this combination of a silicon die and packaging for that die. The chip image determines the limits on the placement of I/O cells on the silicon die and package combination.

An integrated circuit process technology has scaled down to smaller and smaller dimensions, particularly in the 0.25 micron size and smaller, resistance has increased in the chip power distribution network, resulting in higher IR voltage drops throughout. ASIC chip I/O counts per die have also been increasing. With more I/O cells switching, total noise increases and it has become significantly more difficult to place I/O cells in a proposed I/O cell layout that is workable. Chip voltages have also been decreasing producing lower noise margins. The increasing complexity of the on chip metal wiring has made manual IR drop calculations difficult, while the increasing frequencies of ASIC chips has made it important to decrease noise.

Although most ASIC designs are given a very comprehensive analysis of timing, test coverage, DRC and LVS, the electrical analysis of the power bus is very limited in scope. Some ASIC designs continue to fail for reasons not predicted before the design is manufactured due to the limited scope of the power bus analysis. Some of these failures have been traced to power supply compression resulting from resistive IR voltage drop and inductive di/dt noise caused by switching high speed I/Os. When power supply compression occurs it manifests itself as timing problems or functional failure caused by false switching.

The variety of die sizes and packages available for ASICs make it difficult to provide general I/O placement and electrical checking guidelines. A contributing problem is the desirability of freezing I/O cell assignments early in the design cycle to allow for the manufacturing lead time of cards or modules intended to receive the ASIC chip. As a result, I/O cell placement has heretofore been a manual process completed early in the design without significant electrical checking.

Designers have typically done this manual check based only on general noise and electromigration design guidelines. Detailed noise analysis with tools such as ASX or H-SPICE simulation has been possible, but this is a long process involving hard work and has either been done late in the design cycle or not at all.

Problems identified late in the design cycle require extensive rework including I/O cell placement changes, substituting high power I/O cells with lower power I/O cells, chip floorplanning, layout, timing and checking, all of which increases cost.

Power and ground bus electromigration checking has also typically been done manually. To shorten the time required for this activity, analysis has been done only for small areas which were thought to represent the areas of worst case electromigration. While this shortened the time required for analysis it often missed problem areas and it lacked accuracy. Power and ground bus IR drop checking was seldom done due to its complexity.

Although prior art extraction tools for doing IR voltage drop analysis and EM analysis are available, such tools can only be used late in the design process when the repair of errors is more difficult and costly. Extraction analysis is also a relatively lengthy and expensive process.

It would, therefore, be a distinct advantage to have a method and apparatus that could provide a method of analyzing I/O cell layouts for integrated circuits that can be completed quickly and easily at an early stage in the design process. It would be further advantageous if the method and apparatus could provide a simplified method of analyzing I/O cell layouts for power and ground bus IR drop problems, as well as noise and electromigration problems. The present invention provides such a method and apparatus.

SUMMARY OF THE INVENTION

In one aspect, the present invention is a method of analyzing I/O cell layouts for integrated circuits that starts with the step of providing data defining a proposed I/O cell layout for a plurality of I/O cells, the data including a selected chip image. The chip image is selected by a designer to accommodate the proposed I/O cell layout. The data includes a specified I/O cell type and a specified I/O cell location for each I/O cell used in the proposed I/O cell layout. The method also includes the steps of providing a set of limit rules for the selected chip image, the limit rules defining limits on the layout of I/O cells on the selected chip image, providing characteristics for each I/O cell type used in the proposed I/O cell layout, checking the proposed I/O cell layout by applying the data defining the proposed I/O cell layout and the characteristics for each I/O cell type used in the proposed I/O cell layout to the limit rules for the selected chip image, and reporting all I/O cells used in the proposed I/O cell layout that do not meet the limit rules for the selected chip image.

In the preferred embodiment, the method of analyzing I/O cell layouts for integrated circuits includes selecting the chip image from among a plurality of available chip images and the proposed I/O cell layout includes I/O cells selected from among a plurality of available I/O cells suitable for use on the selected chip image. The step of providing a set of limit rules for the selected chip image preferably comprises selecting the set of limit rules for the selected chip image from among a plurality of sets of limit rules previously prepared for the plurality of available chip images.

In the step of providing characteristics for each I/O cell type used in the proposed I/O cell layout the characteristics for each I/O cell type are selected from among a plurality of characteristics previously determined for the plurality of available I/O cells.

In the step of providing data defining a proposed I/O cell layout, the data may include data defining duty cycle, switching factor, loading data, termination data, chip operating temperature and desired chip lifetime data.

The step of reporting all I/O cells used in the proposed I/O cell layout that do not meet the limit rules for the selected chip image may be performed by providing a text file report. However, in the most highly preferred embodiment of the invention, the reporting step includes providing a graphical image of the proposed I/O cell layout for the selected chip image with the cells used in the proposed I/O cell layout that do not meet the limit rules for the selected chip image being marked in the graphical image, preferably by highlighting in color.

The method of the present invention may also include the steps of modifying the proposed layout to meet the limit rules, checking the modified proposed I/O cell layout by applying the data defining the modified proposed I/O cell layout and the characteristics for each I/O cell type used in the modified proposed I/O cell layout to the limit rules for the selected chip image, and revising the graphical image to mark only I/O cells used in the modified proposed I/O cell layout that do not meet the limit rules for the selected chip image.

One aspect of the method of analyzing I/O cell layouts includes providing IR limits in the set of limit rules and the step of checking the proposed I/O cell layout includes power bus IR voltage drop limit checking. Another aspect of the method of analyzing I/O cell layouts includes providing electromigration limits in the set of limit rules and the step of checking the proposed I/O cell layout includes electromigration limit checking. Still another aspect of the method of analyzing I/O cell layouts includes providing di/dt limits in the set of limit rules and the step of checking the proposed I/O cell layout includes di/dt noise limit checking.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
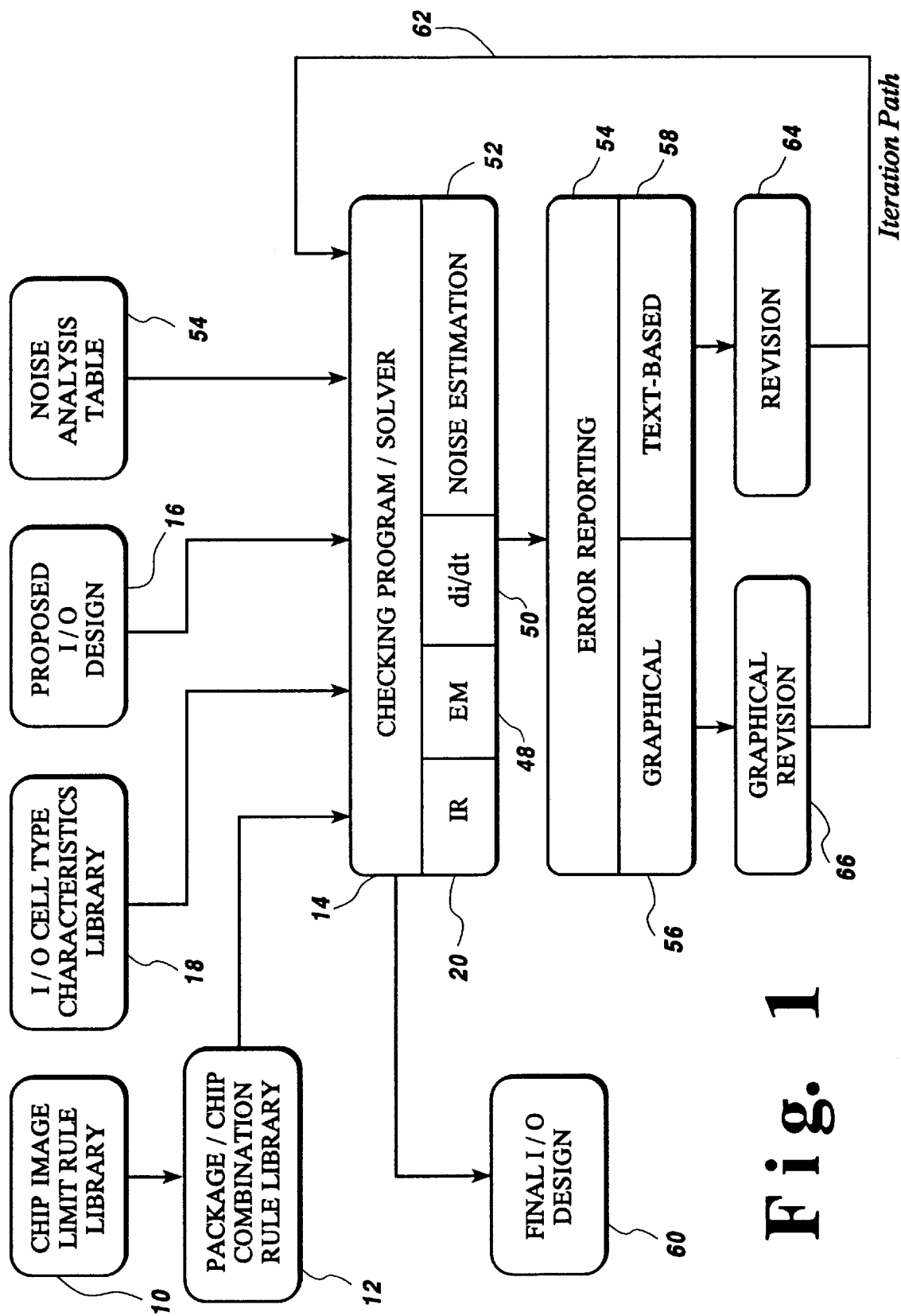
FIG. 1 is a block diagram showing inputs to a checking program implementing the present invention and the flow of that invention.

In describing the preferred embodiment of the present invention, reference will be made herein to FIGS. 1–2 of the drawings in which like numbers refer to like features of the invention. Features of the invention are not necessarily shown to scale in the drawings.

In order to understand the method of the present invention, a brief description of the design process is helpful. The present invention is described in connection with the design of a custom ASIC chip, but it is also applicable to design of other integrated circuits.

The ASIC chip designer knows the intended function of the ASIC and from this function is able to determine the required inputs and outputs to the chip at the beginning of the design process. The chip manufacturer provides a library of standard I/O cell types that the ASIC designer may use and a variety of silicon dies which differ in size and suitable packages for those dies on which the ASIC circuit, including the I/O cells, can be constructed. The designer selects I/O cells as needed to provide communication to and from the ASIC chip. There may be many hundreds of different possible I/O cells that can be used.

Accordingly, at an early stage in the design process, the ASIC chip designer has selected a suitable chip image, including the die and a package, and all the I/O cell types necessary for the ASIC to send and receive the signals it needs. The designer then completes a proposed I/O cell layout by assigning the selected I/O cells to corresponding I/O cell placement locations available on the selected chip image. The present invention can be used to quickly check this proposed layout of the I/O cells before the actual final design of the ASIC chip is completed.

The chip image selected by the designer will define not only the die and package, with associated I/O cell placement slots, but also other factors that limit or affect I/O cell placement, such as variations in the number of layers of metal in the power distribution system on the chip and variations in the number of power supplies. The chip image defines not only where the I/O cells can be positioned, but also sets IR voltage drop limits for the different available I/O cell locations due to the design of the power distribution system, caused by differences in the thickness and length of the wiring supplying each I/O location.

FIG. 1 shows a first step in implementing the present invention by preparing a limit rule library 10 for the selected die and then adjusting or modifying the limit rule library 10, as necessary for the particular package in which the die may be installed, to provide a package/chip combination rule library 12 for the selected chip image. The representation of the limit rule libraries 10, 12 in FIG. 1 is intended to show the process of the construction of a final set of rules 12 that limit I/O cell placement due to the chip image design, regardless of how the rules are developed. The final rules may be constructed by modifying a base set of rules 10 to accommodate variations in packaging, power supply design, etc., by fully analyzing the final design without intermediate rule generation, by applying empirically derived rules, or by any combination of these or other known methods.

The final limit rules 12 for the selected chip image include rules limiting the IR voltage drop at each available I/O cell placement location, rules providing electromigration (EM) limits and noise limit rules. The limit rule library 12 includes all the factors controlled by the selection of the chip image, including, not only the limits for IR, EM and noise, but also the factors set by the selected chip image that control how to calculate the IR voltage drop and EM throughout the chip image. For example, to determine if IR voltage drop limits are exceeded, one must know the current limits and the resistance of the segment of the power grid supplying the I/O cells in the chip image. Both the current limit and the resistances are found in the library 12 for the selected chip image.

The rule generation process for implementing this invention is easiest for peripheral chip image ASIC designs where the power bus geometry, I/O slot locations and power pad connections repeat in identical patterns around the edges of the die.

The final chip image limit rules 12 are used by a checking program 14 that implements the present invention. The limit rules for the selected chip image define limits on the layout of I/O cells on each available chip image. The ASIC designer selects the desired chip image and creates an initial proposed I/O design 16. The proposed I/O design specifies such things as the I/O cell types to be used, the slots on the chip image where the selected I/O cells are to be located and all other factors pertinent to the I/O design. The I/O cell types used are selected from a library of available I/O cell types that have known characteristics.

The present invention uses a library of those I/O cell type characteristics 18 to check the proposed I/O design 16. For example, some I/O cells require more current than others. This limits the possible placement of such I/O cells on the selected chip image to a restricted subset of the available I/O cell placement locations that can supply the necessary current. The proposed placement of one I/O cell may affect other cells, as groups of cell placement slots may be supplied by the same power distribution wiring, and this may limit the total current draw of all the I/O cells placed in that group.

The proposed I/O design 16 also includes such characteristics as the designer's intended load on the I/O cells, the switching factor, I/O duty cycle, the temperature at which the design is proposed to operate, and a proposed operational lifetime in terms of thousands of power on hours (KPOH).

The checking program 14 of the present invention includes a conventional fast circuit solver that uses the inputs from 16, 18 to determine whether the limit rules 10, 12 have been exceeded. Specifically, IR voltage drop limits on the power supply grid are checked by a portion 20 of the checking program 14 using a circuit model of the type seen in FIG. 2 in which the current characteristics of the selected I/O cell type are modeled as current sources 22, 24, 26 and 28, known from the I/O cell type characteristics library 18. The chip image characteristics and associated limit rules are known from 12 which provides the resistances 30, 32, 34, 36, 38, 40, 42, 44 and 46 in the power supply grid connected to the available I/O cell locations. The checking program solver can then determine the IR voltage drop in the power distribution system of the proposed I/O cell layout design and compare it to the limits in the limit rule library 12.

The I/O cell type characteristics library 18 contains information about the current draw characteristics of each I/O cell that a designer may use. However, the actual current used by each I/O circuit also depends on other factors that are set by the circuit designer. These factors include the duty cycle that each I/O cell will operate at as well as switching factor, loading and termination for the I/O cells. This information is stored in the proposed I/O design 16 provided by the designer.

To determine the actual currents for each I/O cell, the checking program 14 takes input from the I/O cell type characteristics library 18 regarding the current characteristics of each I/O cell, and then applies the applicable other factors set by the designer from the proposed I/O design 16. The solver calculates currents for each I/O cell based on its usage and the checking program then checks against the limit rules in the package/chip combination rule library 12.

The checking program 14 also has a portion 48 which does electromigration analysis from the current analysis and the proposed operating temperature and lifetime parameters obtained in the proposed I/O design 16 provided by the designer. In addition to the IR and EM checking, the checking program has a portion 50 that performs di/dt noise checking from the output of the solver based on the input parameters such as switching factor, termination and load from the designers proposed I/O cell layout design 16.

An alternative type of noise analysis is noise estimation 52 based upon a noise analysis table 54 determined empirically and applied across a wide variety of different available chip images. The noise analysis table is dependent upon factors such as the duty cycle for each I/O proposed by the designer in specifications 16 and is scaled according to the number of switching I/O cells. This noise estimation 52 may be performed as an alternative to the di/dt noise analysis.

The checking done by the checking program 14 of the present invention is greatly simplified when applied to a peripheral chip image ASIC design for the same reasons that the rule generation for peripheral chip image ASIC designs is simplified. The repeating patterns around the chip perimeter allow the checking program to avoid having to do a detailed analysis using lower level information such as power bus dimensions, wirebond pad layout, image C4 layout and the like.

The output of the checking program 14 is the error reporting portion 54 which may provide either a graphical output 56 or a text file output 58. The error report output identifies those I/O cells in the proposed I/O design 16 that exceed the limit rules obtained from the limit rule library 12. If there are no errors found, the final I/O design 60 is selected. However, if errors are found, revisions can be suggested by SW from which designer may work from, or they can use their original design and correct the errors made by the designer to provide a new proposed I/O design and the I/O design is refined along iteration path 62 by rechecking the new proposed design.

Generally, the proposed I/O design 16 is provided in a text file, and the new proposed design may be prepared by altering the original text file to provide a revised text file 64. Alternatively, if the error reporting is done graphically in the graphical error reporting portion 56 of the checking program, a graphical revision tool 66 is provided. The graphical error reporting portion 56 of the checking program shows the proposed I/O cell layout 16 and highlights the cells determined by the checking program 14 to exceed the limit rules 12.

The graphical error reporting portion 56 of the checking program provides an option to highlight only those cells exceeding the various checking portions 20, 48, 50 or 52 of the program so that the designer knows whether the proposed I/O cell placement violates IR, EM or noise limits. In conjunction with the graphical display of errors, the present invention provides a graphical revision tool 66 that allows the designer to dynamically change I/O cell types and move the proposed I/O cells into new locations, then recheck the revised design. The graphical error reporting portion 56 of the checking program may also use different colors to identify the cells exceeding the various checking portions 20, 48, 50 or 52 of the program.

To correct an error, repair activity may include moving I/O cells to different locations, changing the power codes of I/O cells to a lower power level, or adding additional connections to the power or ground bus. The additional power or ground connections may be added by inserting special I/O cells into the design near the problem I/O cell. The special I/O cells provide better connections to the power distribution system of the chip, but occupy an I/O slot and prevent any other I/O cell from occupying that slot.

After changes are made, the revised design is checked again, and if necessary further changes are made until a design meets all the checking limits.

Table 1 provides a sample of a portion of a typical chip image limit rule library 12 prepared in a commented input file format:

TABLE 1

;Re-group I (di/dt) groups at 800 mA/ns
;Resistance in ohms (power book includes transfer pad resistance)

| | | | | | | |
|---|---|---|---|---|---|---|
| R_CORNER_GND | | | | | | 0.08 |
| R_CORNER_VD2 | | | | | | 0.13 |
| R_GND_BOOK | | | | | | 0.11 |
| R_VD2_BOOK | | | | | | 0.13 |
| R_GND_BOOK_A | | | | | | 0.13 |
| R_VD2_BOOK_A | | | | | | 0.13 |
| R_IO_SLOT | | | | | | 0.03 |

;GND_CPAD indicated a corner pad
;_PIN indicates a power/gnd book
;G### group checking is EM limit (mA) for transfer pad
;H### group checking is EM limit (mA) for M3/M4/MT power buses
;I### group checking is recommended di/dt limit (mA/ns)

| ;SUPPLY | I/O | GRP1 | LIM1 | GRP2 | LIM2 | GRP3 | LIM3 |
|---|---|---|---|---|---|---|---|
| GND_CPAD | SAA | | | | | | |
| GND | SAA | G001 | 118.00 | H001 | 120.00 | I001 | 800.00 |
| GND | SAB | G001 | 118.00 | H001 | 120.00 | I001 | 800.00 |
| GND | SAC | G001 | 118.00 | H001 | 120.00 | I001 | 800.00 |
| GND | SAD | G002 | 130.00 | H002 | 120.00 | I001 | 800.00 |
| GND | SAE | G002 | 130.00 | H002 | 120.00 | I001 | 800.00 |
| GND_PIN | SAF | G002 | 130.00 | H002 | 120.00 | I001 | 800.00 |
| GND | SAG | G002 | 130.00 | H003 | 120.00 | I002 | 800.00 |
| GND | SAH | G002 | 130.00 | H003 | 120.00 | I002 | 800.00 |
| GND | SAI | G002 | 130.00 | H003 | 120.00 | I002 | 800.00 |
| GND | SAJ | G002 | 130.00 | H003 | 120.00 | I002 | 800.00 |
| GND | SAK | G003 | 130.00 | H004 | 120.00 | I002 | 800.00 |
| GND | SAL | G003 | 130.00 | H004 | 120.00 | I002 | 800.00 |
| GND | SAM | G003 | 130.00 | H004 | 120.00 | I002 | 800.00 |
| GND_PIN | SAN | G003 | 130.00 | H004 | 120.00 | I002 | 800.00 |
| GND | SAO | G003 | 130.00 | H005 | 120.00 | I003 | 800.00 |
| GND | SAP | G003 | 130.00 | H005 | 120.00 | I003 | 800.00 |
| GND | SAQ | G003 | 130.00 | H005 | 120.00 | I003 | 800.00 |
| GND | SAR | G003 | 130.00 | H005 | 120.00 | I003 | 800.00 |
| GND | SAS | G004 | 130.00 | H006 | 120.00 | I003 | 800.00 |

TABLE 1-continued

| GND | SAT | G004 | 130.00 | H006 | 120.00 | I003 | 800.00 |
|---|---|---|---|---|---|---|---|
| GND | SAU | G004 | 130.00 | H006 | 120.00 | I003 | 800.00 |
| GND_PIN | SAV | G004 | 130.00 | H006 | 120.00 | I003 | 800.00 |
| GND | SAW | G004 | 130.00 | H007 | 120.00 | I004 | 800.00 |
| GND | SAX | G004 | 130.00 | H007 | 120.00 | I004 | 800.00 |
| GND | SAY | G004 | 130.00 | H007 | 120.00 | I004 | 800.00 |
| GND | SAZ | G004 | 130.00 | H007 | 120.00 | I004 | 800.00 |
| GND | SBA | G004 | 130.00 | H007 | 120.00 | I004 | 800.00 |
| GND | SBB | G004 | 130.00 | H007 | 120.00 | I004 | 800.00 |
| GND | SBC | G004 | 130.00 | H007 | 120.00 | I004 | 800.00 |
| GND | SBD | G004 | 130.00 | H007 | 120.00 | I004 | 800.00 |

Table 1 is organized into two halves. The upper half provides resistance values for the power grid, needed by the circuit solver. The lower half provides various grouping and limit information for the I/O cells. Comment information in the table is marked in the first character position with a semicolon.

Beginning with the first non-comment lines of Table 1, the resistance of power leads feeding the different I/O cell locations is provided. For example, the corner ground pads, such as corner ground pads 34 and 42 (see FIG. 2), have a resistance (R_CORNER_GND) of 0.08 ohms. These resistances are used by the solver portion of checking program 14 to solve the circuit model of FIG. 2 and determine the currents throughout. Due to the repetitive nature of the power distribution system design, there are only a limited number of resistance values that need to be provided.

At the bottom of Table 1, are numerous rows of data, one row for each available I/O location, organized into eight columns of data. The first column, SUPPLY, defines the type of I/O slot. The second column, I/O, provides an I/O location reference number, SAA, SAB, SAC, etc. The available I/O slots are grouped into different groupings under the GRP1, GRP2 and GRP3 headings, and each group has a corresponding limit, LIM1, LIM2 and LIM3 for a parameter, such as EM and di/dt noise.

Membership in a group of cells for purposes of checking the associated limit in LIM1, LIM2 or LIM3 is denoted by the G001, G002 and G003 labels, etc. in column GRP1, by the H001, H002 and H003 labels, etc. in column GRP2 and by the I001, I002 and I003 labels, etc. in column GRP3. All cells in a common group for purposes of limit checking have the same G###, H### or I### label in its GRP1, GRP2 or GRP3 column.

For example, available I/O cell placement location SAA is a member of groups G001, H001 and I001. Available I/O placement location SAD is a member of groups G002, H002 and I001. The total current limit for all members of group G001 (which includes SAA, SAB and SAC) for the GRP1/LIM1 electromigration checking is 118.0 milliAmps. The limit for all members of group I001 (which includes SAA, SAB, SAC, SAD, SAE and SAF) for the GRP3/LIM3 di/dt noise checking is 800 milliAmps/nanosecond. In this manner, the particular limits are specified for each available I/O placement location on each proposed chip image.

Figure 2:
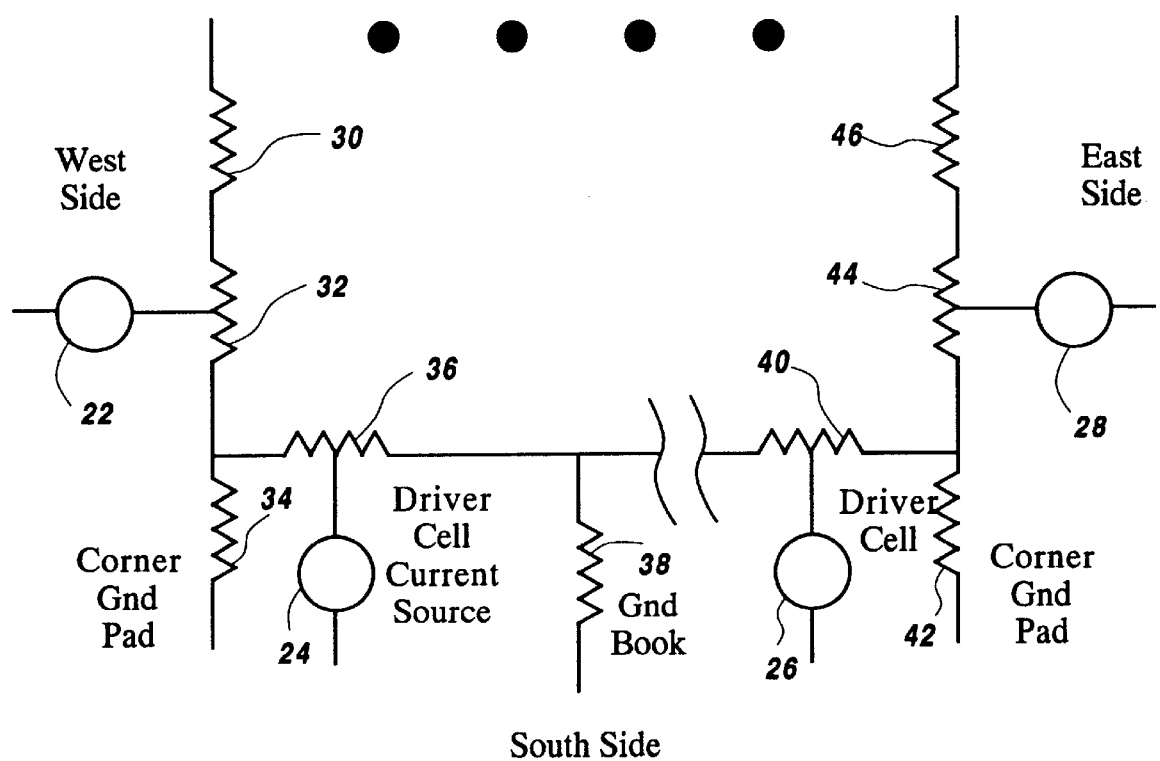
FIG. 2 is sample circuit model used in the solver portion of the checking program seen in FIG. 1.

The circuit solver portion of the checker 14 proceeds to solve the proposed design in a conventional manner using these characteristics and the predetermined layout for the chip image as shown in FIG. 2 to determine where the limits from Table 1 are met or exceeded.

It should be noted that neither a netlist, nor other details of the functional ASIC chip design circuitry are required to conduct the I/O analysis of this invention. Only the I/O cells, and their location and type, with other generalized parameters, such as operating temperature, and I/O loading, termination and switching factor are needed. Thus, the analysis can be performed quickly, and most importantly, at a very early stage in the ASIC chip design when changes to the I/O cells are most easily made with the least impact on other components, such as the circuit board on which the ASIC chip will be mounted.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention,
What is claimed is:

1. A method of analyzing I/O cell layouts for integrated circuits, the method comprising the steps of:
   providing data defining a proposed I/O cell layout for a plurality of I/O cells;
   providing a set of limit rules for a selected chip image, the limit rules defining limits on the layout of I/O cells on the selected chip image;
   providing characteristics for each I/O cell type used in the proposed I/O cell layout;
   checking the proposed I/O cell layout using a fast circuit solver by applying the data defining the proposed I/O cell layout and the characteristics for each I/O cell type used in the proposed I/O cell layout to the set of limit rules; and
   reporting all I/O cells in the proposed I/O cell layout that do not meet the set of limit rules for the selected chip image.

2. The method of analyzing I/O cell layouts for integrated circuits according to claim 1 wherein the selected chip image is selected from among a plurality of available chip images and the proposed I/O cell layout includes I/O cells selected from among a plurality of available I/O cells suitable for use on the selected chip image.

3. The method of analyzing I/O cell layouts for integrated circuits according to claim 2 wherein the step of providing a set of limit rules for the selected chip image comprises selecting the set of limit rules for the selected chip image from among a plurality of sets of limit rules previously prepared for the plurality of available chip images.

4. The method of analyzing I/O cell layouts for integrated circuits according to claim 2 wherein the step of providing characteristics for each I/O cell type used in the proposed I/O cell layout comprises selecting the characteristics for each I/O cell type from among a plurality of characteristics previously determined for the plurality of available I/O cells.

5. The method of analyzing I/O cell layouts for integrated circuits according to claim 1 wherein the step of providing data defining a proposed I/O cell layout includes providing data including duty cycle data for the plurality of I/O cells.

6. The method of analyzing I/O cell layouts for integrated circuits according to claim 1 wherein the step of providing data defining a proposed I/O cell layout includes providing data including switching factor data for the plurality of I/O cells.

7. The method of analyzing I/O cell layouts for integrated circuits according to claim 1 wherein the step of providing data defining a proposed I/O cell layout includes providing data including operating temperature and desired chip lifetime data.

8. The method of analyzing I/O cell layouts for integrated circuits according to claim 1 wherein the step of providing data defining a proposed I/O cell layout includes providing data including I/O cell loading and termination data for the plurality of I/O cells.

9. The method of analyzing I/O cell layouts for integrated circuits according to claim 1 wherein the step of reporting all I/O cells used in the proposed I/O cell layout that do not meet the limit rules for the selected chip image comprises providing a text file report.

10. The method of analyzing I/O cell layouts for integrated circuits according to claim 1 wherein the step of reporting all I/O cells used in the proposed I/O cell layout that do not meet the limit rules for the selected chip image comprises providing a graphical image of the proposed I/O cell layout for the selected chip image with the I/O cells used in the proposed I/O cell layout that do not meet the limit rules for the selected chip image being marked in the graphical image.

11. The method of analyzing I/O cell layouts for integrated circuits according to claim 10 further including the steps of:

modifying the proposed layout to meet the limit rules;

checking the modified proposed I/O cell layout by applying the data defining the modified proposed I/O cell layout and the characteristics for each I/O cell type used in the modified proposed I/O cell layout to the limit rules for the selected chip image; and revising the graphical image to mark only I/O cells used in the modified proposed I/O cell layout that do not meet the limit rules for the selected chip image.

12. The method of analyzing I/O cell layouts for integrated circuits according to claim 1 wherein the step of providing a set of limit rules for the selected chip image includes providing IR limits and the step of checking the proposed I/O cell layout includes power bus IR drop limit checking.

13. The method of analyzing I/O cell layouts for integrated circuits according to claim 1 wherein the step of providing a set of limit rules for the selected chip image includes providing electromigration limits and the step of checking the proposed I/O cell layout includes electromigration limit checking.

14. The method of analyzing I/O cell layouts for integrated circuits according to claim 1 wherein the step of providing a set of limit rules for the selected chip image includes providing di/dt limits and the step of checking the proposed I/O cell layout includes di/dt noise limit checking.

15. The method of analyzing I/O cell layouts for integrated circuits according to claim 1 wherein:

the step of providing data defining a proposed I/O cell layout for a plurality of I/O cells includes providing data defining a selected package for the selected chip image; and the step of providing a set of limit rules for the selected chip image includes providing a set of limit rules for the selected chip image when the selected chip image is mounted in the selected package.

16. The method of analyzing I/O cell layouts for integrated circuits according to claim 1 wherein the step of providing a set of limit rules for the selected chip image includes providing current limit rules for groups of I/O cell placement locations.

17. The method of analyzing I/O cell layouts for integrated circuits according to claim 1 wherein the step of providing data defining a proposed I/O cell layout for a plurality of I/O cells includes providing duty cycle, switch factor and load termination data for each I/O cell.

18. A method of checking I/O cell placement for IR drop and noise for a peripheral chip image, the method comprising the steps of:

proposing an I/O cell layout containing duty cycle, switch factor and load termination at which each I/O cell will operate at;

creating a set of rules for the I/O cells and the chip image;

applying the rules to each of the I/O cells for duty cycle, switch factor and load termination;

checking the proposed an I/O cell layout against the set of rules using a fast circuit solver; and reporting the IR drop and noise characteristics of the chip image as indicated after the application of the rules.

19. The method of checking I/O cell placement for IR drop and noise for a peripheral chip image according to claim 18, further including the steps of:

receiving a revised I/O cell placement; and applying the rules to each of the I/O cells in the revised I/O cell placement for duty cycle, switch factor and load termination; and reporting the IR drop and noise characteristics for the revised I/O cell placement after the application of the rules.

20. The method of analyzing I/O cell layouts for integrated circuits according to claim 1 wherein the data defining the proposed I/O cell layout includes a selected chip image, selected to accommodate the proposed I/O cell layout, and a specified I/O cell type and a specified I/O cell location for each I/O cell used in the proposed I/O cell layout.

* * * * *